United States Patent [19]

Hardy, Jr. et al.

[11] Patent Number: 5,086,431
[45] Date of Patent: Feb. 4, 1992

[54] INCREASED INTENSITY LASER DIODE SOURCE CONFIGURATION

[75] Inventors: Arthur H. Hardy, Jr.; William C. Schubert, both of Santa Barbara, Calif.

[73] Assignee: Santa Barbara Research Center, Goleta, Calif.

[21] Appl. No.: 631,589

[22] Filed: Dec. 21, 1990

[51] Int. Cl.$^5$ .............................................. H01S 3/19
[52] U.S. Cl. ...................... 372/50; 372/36; 385/15
[58] Field of Search ............... 372/50, 36; 350/96.15, 350/96.11, 96.12

[56] References Cited

U.S. PATENT DOCUMENTS

| | | | |
|---|---|---|---|
| 3,803,511 | 4/1974 | Thompson | 372/108 |
| 4,993,801 | 2/1991 | Sarraf | 372/36 |
| 4,995,050 | 2/1991 | Waarts et al. | 372/108 |

Primary Examiner—Léon Scott, Jr.
Attorney, Agent, or Firm—W. C. Schubert; W. K. Denson-Low

[57] ABSTRACT

A semiconductor laser chip having one or more lasing junctions is mounted on one side of a thin sheet of thermally conductive material opposite to a second semiconductor laser chip of the same construction mounted on the opposite side. The thin sheet of material allows the emitting facets of the semiconductor laser chips to be placed in close proximity for coupling into the end of an optical fiber or other use. Made of hardened copper or other suitable material, the thin sheet of material serves as a heat conducting path between the semiconductor laser chips and a heat sink. Different configurations may utilize different shapes for the thin sheet of material; the thin sheet may have parallel opposing sides or opposing sides that are at an angle with respect to one another.

9 Claims, 1 Drawing Sheet

INCREASED INTENSITY LASER DIODE SOURCE CONFIGURATION

FIELD OF THE INVENTION

This invention relates generally to the use of laser diode sources and, in particular, to configurations for supplying high density laser diode radiation for coupling to fiber optics or other applications.

BACKGROUND OF THE INVENTION

Semiconductor diode lasers, also referred to as laser diodes or injection lasers, offer the advantages of small physical size and small emitted beam at the emitting facet of the semiconductor chip. Many systems that could possibly use laser diodes require higher intensity for the laser radiation than has heretofore been pratical.

One of the objects of the present invention is to increase the intensity of laser radiation originating with diod lasers that is available to couple into an optical fiber or for other use over that which is available from a laser diode chip.

It is another object of the present invention to provide a small source of high intensity laser radiation for other applications that do not utilize fiber optics.

SUMMARY OF THE INVENTION

The present invention achieves a small, high-intensity source of laser radiation in a device having first and second semiconductor diode laser chips mounted in thermal contact with a thin sheet of thermally conductive material on opposite sides thereof. Each semiconductor diode laser chip will be oriented such that its emitting junction is adjacent to thermally conductive material. The thin sheet of material provides a highly thermally conductive path to a heat sink to enable the semiconductor lasers on each side of the thin sheet of material to work efficiently. The laser radiation that is available for coupling into the end of an optical fiber or for other use is thereby appoximately doubled over that which would be available from a single semiconductor laser chip.

DESCRIPTION OF THE DRAWINGS

The present invention will be explained using as an example a device in which a single lasing junction is fabricated on each semiconductor laser chip. However, the present invention is of more general applicability, in that each semiconductor laser chip may have one or any other number of lasing junctions that are or may become technologically achievable on a chip.

Figure 1:
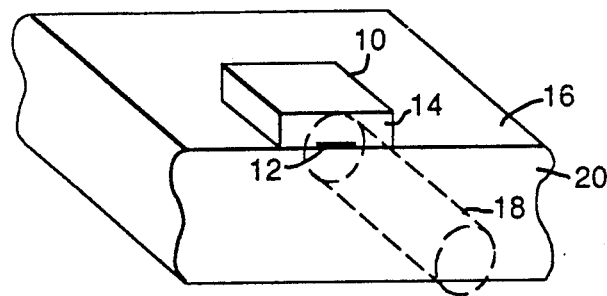
FIG. 1 is a schematic representation of a semiconductor laser diode chip having a lasing junction in contact with a heat sink as in the prior art.

In the prior art, as shown in FIG. 1, a semiconductor chip 10 having its lasing junction 12 on its emitting facet 14 is mounted directly on a heat sink 16 with the emitting junction down. The heat sink 16 holds the semiconductor chip 10 so that the lasing junction 12 is close to heat sink 16. The efficiency with which the lasing junction 12 operates is determined in large part by how effectively heat is removed therefrom, accounting for the mounting shown in FIG. 1.

An optical fiber 18, shown in phantom in FIG. 1, is typically bonded to the emitting facet 14 and the co-planar face 20 of the heat sink 16 to capture the maximum amount of laser radiation emitted by the lasing junctions 12. An optically transparent epoxy may be used for this purpose.

Figure 2:
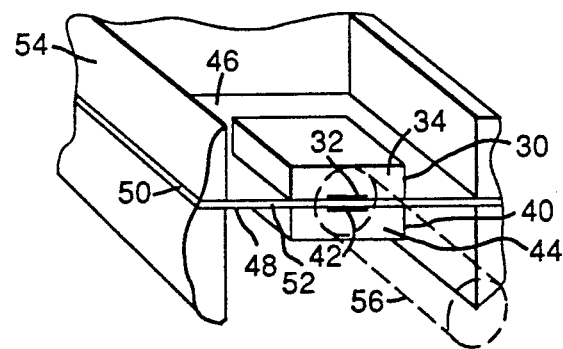
FIG. 2 is a schematic representation of a preferred embodiment of the present invention in which two semiconductor laser diode chips are mounted opposite one another on a flat, thermally conducting sheet of material coupled to a heat sink.

In the present invention, as shown in FIG. 2, each of the semiconductor chips 30 and 40 may be identical to semiconductor chip 10 described with respect to FIG. 1. Each of the semiconductor lasers 30 and 40 may comprise a single lasing junction, as is more typically readily available at the present time, or several laser junctions should such lasers be available. The semiconductor lasers 30 and 40 could also each comprise a plurality of lasing junctions arranged end to end. The present invention is applicable with all such semiconductor lasers 30 and 40 that are or may become available.

The semiconductor lasers 30 and 40 are mounted on opposite sides 46 and 48 of a thin section 50 of heat conducting material, such as hardened copper or an alloy of such, so that their emitting facets 34 and 44 are approximately co-planar with one another and with the edge 52 of thin section 50. On the one hand, thin section 50 should be sufficiently thin to allow the lasing junctions 32 and 42 to be closely located to one another to increase the effective intensity of the configuration; while on the other hand, the thin section 50 must provide a sufficient heat path for heat generated by the lasing junctions 32 and 42 and also provide sufficient rigidity to support the semiconductor lasers 30 and 40. For this purpose, the thin section 50 may be on the order of 1.5 mils in thickness. The particular thickness of the thin section 50 would depend upon the particular semiconductor lasers utilized.

The thin section 50 is in thermal contact with a heat sink 54 to which heat from the semiconductor lasers 30 and 40 is conducted. The area between the semiconductor lasers 30 and 40 and proximate portions of the heat sink 54 may be filled with a material having appropriate thermal and electrical properties to provide greater rigidity and better heat transfer for the configuration.

An optical fiber 56 similar to the optical fiber 18 may be placed adjacent to or in contact with the emitting facets 34 and 44 and the edge 52 of the thin section 50. It will be appreciated that where the semiconductor laser chips 30 and 40 are similar to the semiconductor laser 10, shown in FIG. 1, on the order of twice the intensity of laser radiation will be transmitted into the fiber 56 as was transmitted into the fiber 18. Optical fibers suitable for an application such as this may be on the order of 100-300 microns in diameter.

The thin section 50 has been described above as having its edge 52 co-planar with the emitting facets 34 and 44 of the semiconductor lasers 30 and 40. It is within the scope of the present invention to recess the edge 52 from the plane defined by the emitting facets 34 and 44 if desired.

Figure 3:
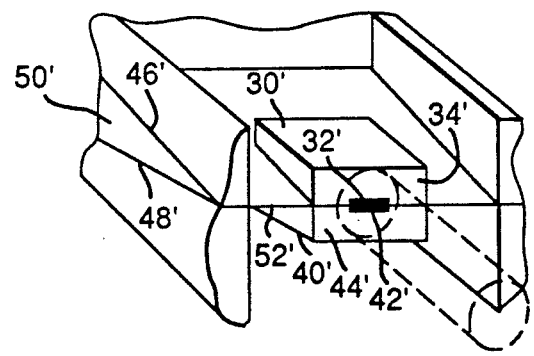
FIG. 3 is a schematic representation of a preferred embodiment of the present invention in which the thermally conductive sheet of material increases in thickness with distance from its edge and the emitting facets of the semiconductor laser chips. This allows the emitting junction from the two laser chips to be almost in contact with each other.

In an alternate embodiment of the present invention illustrated schematically in FIG. 3, the thin section 50' increases in thickness away from the edge 52'. In this configuration, the emitting facets 34' and 44' of the semiconductor laser diode chips 30' and 40' are not parallel, but are in fact tilted slightly toward one another. In certain variations of the embodiment of the present invention, shown in FIG. 3, the opposite sides 46' and 48' of the thin section 50' may in fact meet at edge 52' so that the semiconductor chips 30' and 40' may have lasing junctions 32' and 42' that are more closely spaced in the embodiment of FIG. 2 that utilizes a thin section 50 having parallel sides 46 and 48. Rigidity and heat conduction could also be enhanced using the configuration of FIG. 3 with such an arrangement. The angle selected would depend upon the particular beam patterns of the laser diode chips 30' and 40' and other design constraints.

It will be appreciated from the above description of the present invention that there are many variations possible with respect to locating the semiconductor lasers on each side of a thin heat conducting section of material coupled to a heat sink, and that the selection of any particular configuration will depend on the semiconductor lasers utilized as well as the desired result.

What is claimed is:

1. A small, high-intensity source of semiconductor laser radiation comprising:
   a sheet of thermally conductive material having first and second sides and an edge therebetween;
   a first semiconductor laser chip mounted in thermal contact with the first side of said sheet, said first semiconductor laser chip having an emitting facet with at least one lasing junction, said chip mounted with said facet proximate to said edge such that a lasing junction on said chip is located to emit laser radiation along a line proximate to said edge;
   a second semiconductor laser chip mounted in thermal contact with the second side of said sheet opposite said first chip, said second semiconductor laser chip having an emitting facet with at least one lasing junction, said chip mounted with said facet proximate to said edge such that a lasing junction on said chip is located to emit laser radiation proximate to said edge opposite said first chip, said thin sheet having a thickness between said first and second sides thereof at said edge so that said first and second semiconductor lasers have lasing junctions that are separated by a distance comparable to the line along which said junctions emit laser radiation or less;
   heat sink means coupled to said sheet for removing heat from said sheet conducted thereto from said first and second chips.

2. A source as in claim 1 wherein said first and second sides of said sheet are parallel and said emitting facets of said first and second semiconductor laser chips are coplanar.

3. A source of laser radiation as in claim 1 wherein said first and second semiconductor lasers each comprise a plurality of lasing junctions arranged parallel to one another.

4. A source of laser radiation as in claim 3 wherein said plurality of lasing junctions on each semiconductor chip are separated from adjacent lasing junctions on said emitting facet by approximately 1 mil or less.

5. A source of laser radiation as in claim 3 wherein said first and second sides of said sheet are tilted at an angle with respect to each other such that said sheet increases in thickness with distance from said edge.

6. A source of laser radiation as in claim 1 wherein said first and second semiconductor lasers each comprise a plurality of lasing junctions that emit laser radiation along a line proximate to said edge.

7. A source of laser radiation as in claim 1 further comprising an optical fiber having an end adjacent to said emitting facets of said first and second semiconductor laser chips so that laser radiation emitted by said lasing junctions is coupled into said optical fiber.

8. A small, high-intensity source of semiconductor laser radiation for coupling into the end of an optical fiber comprising:
   a flat thin sheet of thermally conductive material having an edge, said flat thin sheet having a thickness between first and second sides thereof significantly less than the diameter of said optical fiber;
   a first semiconductor laser chip mounted in thermal contact with the first side of said sheet such that a lasing junction on said chip is located to emit laser radiation proximate to said sheet along said edge;
   a second semiconductor laser chip mounted in thermal contact with the second side of said sheet opposite said first chip such that a lasing junction on said chip is located to emit laser radiation proximate to said sheet along said edge; and
   heat sink means coupled to said sheet for removing heat from said sheet conducted thereto from said first and second chips.

9. A source of laser radiation as in claim 8 wherein said sheet is copper.

* * * * *